US009564333B2

(12) United States Patent
Mevellec et al.

(10) Patent No.: US 9,564,333 B2
(45) Date of Patent: Feb. 7, 2017

(54) METHOD FOR FORMING A METAL SILICIDE USING A SOLUTION CONTAINING GOLD IONS AND FLUORINE IONS

(71) Applicant: ALCHIMER, Massy (FR)

(72) Inventors: Vincent Mevellec, Chaville (FR); Dominique Suhr, Chatenay Malabry (FR)

(73) Assignee: ALCHIMER, Massy (FR)

( * ) Notice: Subject to any disclaimer, the term of this patent is extended or adjusted under 35 U.S.C. 154(b) by 0 days.

(21) Appl. No.: 14/766,389

(22) PCT Filed: Feb. 21, 2014

(86) PCT No.: PCT/FR2014/050365
§ 371 (c)(1),
(2) Date: Aug. 6, 2015

(87) PCT Pub. No.: WO2014/128420
PCT Pub. Date: Aug. 28, 2014

(65) Prior Publication Data
US 2015/0380254 A1    Dec. 31, 2015

(30) Foreign Application Priority Data

Feb. 22, 2013 (FR) ...................... 13 51593

(51) Int. Cl.
| | |
|---|---|
| *H01L 21/44* | (2006.01) |
| *H01L 21/285* | (2006.01) |
| *H01L 21/3205* | (2006.01) |
| *C23C 18/18* | (2006.01) |
| *C23C 18/16* | (2006.01) |
| *C23C 18/34* | (2006.01) |
| *C23C 18/36* | (2006.01) |
| *C23C 18/54* | (2006.01) |
| *H01L 21/28* | (2006.01) |
| *H01L 21/288* | (2006.01) |
| *H01L 31/0224* | (2006.01) |

(52) U.S. Cl.
CPC ..... *H01L 21/28518* (2013.01); *C23C 18/1607* (2013.01); *C23C 18/1639* (2013.01); *C23C 18/1642* (2013.01); *C23C 18/1692* (2013.01); *C23C 18/1696* (2013.01); *C23C 18/1879* (2013.01); *C23C 18/1882* (2013.01); *C23C 18/34* (2013.01); *C23C 18/36* (2013.01); *C23C 18/54* (2013.01); *H01L 21/288* (2013.01); *H01L 21/28052* (2013.01); *H01L 21/32053* (2013.01); *H01L 31/022425* (2013.01)

(58) Field of Classification Search
None
See application file for complete search history.

(56) References Cited

U.S. PATENT DOCUMENTS

| | | | |
|---|---|---|---|
| 3,373,054 A | 3/1968 | Lang et al. | |
| 4,152,824 A | 5/1979 | Gonsiorawski | |
| 5,972,762 A * | 10/1999 | Wu | H01L 29/7834 257/E21.431 |
| 6,406,743 B1 | 6/2002 | Lee et al. | |
| 6,566,254 B1 | 5/2003 | Mikagi | |
| 2003/0214017 A1 | 11/2003 | Yokoi et al. | |
| 2004/0005468 A1* | 1/2004 | Steinecker | C23C 18/1692 428/446 |
| 2005/0153071 A1* | 7/2005 | Bouvrette | B01J 35/0013 427/212 |
| 2006/0251801 A1 | 11/2006 | Weidman et al. | |
| 2007/0048930 A1* | 3/2007 | Figura | H01L 21/82345 438/243 |
| 2007/0295995 A1 | 12/2007 | Yun et al. | |
| 2010/0136244 A1* | 6/2010 | Inagawa | C23C 2/04 427/430.1 |

(Continued)

FOREIGN PATENT DOCUMENTS

WO    WO 2013/043133 A1 *  3/2013  ................ B22F 9/16

OTHER PUBLICATIONS

Magagnin et al.: "Selective deposition of gold nanoclusters on silicon by a galvanic displacement process"; Microelectronic Engineering, vol. 64 (2002), pp. 479-485.

(Continued)

*Primary Examiner* — Reema Patel
(74) *Attorney, Agent, or Firm* — Hamre, Schumann, Mueller & Larson, P.C.

(57) ABSTRACT

A subject matter of the invention is a process for the formation of nickel silicide or of cobalt silicide, comprising the stages consisting in:

exposing the surface of the silicon-comprising substrate with an aqueous solution comprising from 0.1 mM to 10 mM of gold ions and from 0.6 M to 3.0 M of fluorine ions for a duration of between 5 seconds and 5 minutes, depositing by an electroless route, on the activated substrate, a layer essentially composed of nickel or of cobalt, applying a rapid thermal annealing at a temperature of between 300° C. and 750° C., so as to form the nickel silicide or the cobalt silicide.

The aqueous solution comprises a surface-active agent chosen from the compounds comprising at least one anionic or nonionic polar group and an alkyl chain comprising from 10 to 16 carbon atoms.

This process essentially has applications in the manufacture of NAND memories and photovoltaic cells.

19 Claims, 2 Drawing Sheets

(56) References Cited

U.S. PATENT DOCUMENTS

| | | | | |
|---|---|---|---|---|
| 2010/0240213 A1* | 9/2010 | Urano | ............. | H01L 21/288 438/652 |
| 2012/0211818 A1* | 8/2012 | Lee | ............. | H01L 21/28273 257/316 |
| 2012/0325110 A1* | 12/2012 | Brouwer | ............. | C23C 22/78 106/1.22 |

OTHER PUBLICATIONS

Lu et al.: "Nonionic surfactant-capped gold nanoparticles as postcolumn reagents for high-performance liquid chromatography assay of low-molecular-mass biothiols"; Journal of Chromatography A, vol. 1163 (2007), pp. 328-332.

Shang et al.: "Synthesis of gold nanoparticles by reduction of $HAuCl_4$ under UV irradiation"; Solid State Sciences, vol. 15 (2013), pp. 17-23.

International Search Report, Jul. 7, 2014; PCT/FR2014/050365.

* cited by examiner

METHOD FOR FORMING A METAL SILICIDE USING A SOLUTION CONTAINING GOLD IONS AND FLUORINE IONS

The present invention relates generally to the manufacture of electronic devices, such as, in particular, erasable NAND memories used in USB keys, MS cards and SD cards for the storage and the general transfer of data.

The present invention relates to the manufacture of metal silicide by chemical deposition of metal on silicon. It relates in particular to the activation of a substrate comprising a vertical alternation, with respect to its surface, of layers of a dielectric and of a semiconductor, for its subsequent coating with a thin metal layer deposited by an electroless process, also known as an auto-catalytic process.

Nickel silicide is generally formed by deposition of a nickel film on the silicon substrate by a vapor phase process, followed by a rapid thermal annealing (RTA). During this thermal annealing at a temperature generally of the order of 400 to 750° C., the nickel migrates into the silicon layer to form the nickel silicide. The nickel which has not migrated into the silicon and which has remained at the surface of the substrate can subsequently be removed by selective chemical cleaning without damaging the silicide formed.

Nickel silicide is used in particular for the manufacture of interconnections in semiconductor devices used in VLSI integrated circuits. Nickel silicide deposited layers are also of use in the manufacture of NAND memories and MOS transistors.

NAND flash memories store information in a network of memory cells composed of floating-gate transistors (MOS) which are connected in series. In three-dimensional NANDs, it is desirable to be able to produce very thin nickel silicide deposited layers of uniform thickness over the whole of the surface of the structures, the aspect ratios of which are very high, in particular pits with an opening of a few tens of nanometers and with a depth of a few microns.

MOS (metal oxide-semiconductor) transistors often use metal silicide (titanium, cobalt or tungsten silicide) layers to reduce the resistance between two materials.

In MOS transistors having a small gate length or MOS transistors having relatively shallow junctions, it is necessary to produce thinner nickel deposited layers as nickel has a very high diffusion coefficient in silicon, resulting in the formation of nickel silicide regions which can extend below the side walls of the transistor structures and result in operating defects.

In order to obtain a nickel layer of uniform thickness, it is generally necessary to active the silicon surface with palladium. U.S. Pat. No. 6,406,743 has in particular described a process for the manufacture of nickel silicide comprising the activation of the polycrystalline silicon surface with a palladium chloride salt in solution in hydrofluoric acid and acetic acid at ambient temperature for approximately 10 seconds. After this activation stage, a nickel layer with a thickness of 180-220 nm is deposited by an electroless route, for example with a solution of nickel sulfate and dimethylamine-borane in the presence of nickel-complexing agents, such as lactic acid and citric acid. The nickel silicide is formed by bringing the nickel to high temperature (650° C.) so as to cause it to migrate into the silicon.

However, the applicant company has found that the activation with palladium does not make it possible to obtain nickel layers of low and uniform thickness as the activation density of the palladium at the surface of the silicon is too low. The applicant company has also been able to observe that, by using silver or copper to activate the silicon surface, a thin and even layer of nickel is obtained but nickel silicide is not formed during the rapid thermal annealing (RTA) stage.

Provision has already been made to deposit the nickel by a vapor-phase process. However, chemical vapor deposition (CVD or ALD) processes are expensive. They also exhibit the disadvantage, when they are applied to structures exhibiting pits or etched features, of forming very thick deposited layers at the opening and on the acute angles of the structures rather than at the bottoms thereof. When the aspect ratios become too high, for example greater than 5:1, for example of the order of 10:1, the thickness of the layers deposited by CVD becomes too low at the bottom of the structures.

A need thus remains to obtain an even nickel layer of low thickness which can migrate into the silicon by rapid thermal annealing at temperatures which are as low as possible in order to reduce the manufacturing costs. This layer must be obtained by an industrial process which is relatively inexpensive and easy to carry out. This is why depositing the nickel by an auto-catalytic route and not a vapor-phase route has been sought.

It has been discovered, in the context of the present invention, that this objective can be achieved by using a gold salt in aqueous solution and a source of fluorine in the presence of a specific surface-active agent.

A first subject matter of the invention is thus a process for the formation of nickel silicide or of cobalt silicide comprising the stages consisting in:
  bringing the surface of a silicon-comprising substrate into contact with an aqueous solution comprising gold ions and fluorine ions in order to form particles of metallic gold (Au(0)),
  depositing by an electroless route, on the substrate covered with particles of metallic gold, a layer essentially composed of nickel or of cobalt,
  applying a rapid thermal annealing (RTA) at a temperature of between 300° C. and 750° C., so as to form the nickel silicide or the cobalt silicide.

The nickel deposited layer obtained according to the process of the invention conforms to complex specifications:
  it adheres to the silicon substrate,
  it is of unvarying thickness over the entire surface of the substrate, whatever its typology (flat or etched), this being the case even at low thickness, typically less than 50 nm, and
  it diffuses into the silicon during a rapid thermal anneal, even at low temperature, typically of the order of 350° C.

In the structures, the surface of which comprises an alternation of silicon regions and insulating regions, the process of the invention advantageously makes it possible to carry out a selective deposition of the nickel or of the cobalt on the silicon, which limits the excessive use of starting materials and the costs associated with a stage of removal of the nickel which has not migrated into the silicon, on conclusion of the RTA.

For an application in the field of microelectronics, the silicon substrate can be composed of a silicon coupon covered with a layer of silicon dioxide ($SiO_2$) having a thickness of between 70 and 110 nm, followed by a layer of silicon, for example polycrystalline silicon, having a thickness of between 150 and 230 nm.

Polycrystalline silicon, also commonly known as polysilicon or poly-Si, is understood to mean a specific form of silicon which differs from monocrystalline silicon and amorphous silicon. Contrary to the first (composed of just one crystal) and to the second (having no or a very low crystallographic coherence), polycrystalline silicon is composed of multiple small crystals of varied sizes and shapes.

The first stage of the process of the invention consists in bringing the surface of a silicon-comprising substrate into contact with an aqueous solution comprising gold ions and fluorine ions, in order to form gold particles, also known as gold grains, at the surface of the silicon substrate.

The aqueous solution preferably comprises from 0.1 mM to 10 mM of gold ions, preferably from 0.1 mM to 5.0 mM and more preferably from 0.5 mM to 1.0 mM of gold ions. The concentration of gold ions is, for example, between 0.65 mM and 0.75 mM.

In the present patent application, the expressions "ranging from . . . to" and "comprising from . . . to" denote ranges of values comprising their limits. The expression "between . . . and" excludes the limits from the range of values.

The aqueous solution preferably comprises from 0.6 M to 3.0 M of fluorine ions, preferably from 1.0 to 2.0 M, and more preferably from 1.4 to 1.6 M of fluorine ions.

The fluorine ions can be contributed by hydrofluoric acid (HF), by $NH_4F$ or by an $NH_4F$/HF mixture.

The aqueous solution preferably comprises from 0.6 M to 3.0 M of hydrofluoric acid (HF), preferably from 1.0 M to 2.0 M, and more preferably from 1.4 M to 1.6 M of hydrofluoric acid (HF).

The gold ions can be contributed by a gold salt chosen from gold(I) and gold(III) salts, such as gold(I) chlorides, gold(III) chlorides or gold(III) bromide. For example, chloroauric acid ($HAuCl_4$) is chosen.

The aqueous solution preferably comprises from 0.1 mM to 10 mM of gold(III) ions, preferably from 0.1 to 5.0 mM and more preferably from 0.5 to 1.0 mM of gold(III) ions. The concentration of gold(III) ions is, for example, between 0.65 and 0.75 mM.

According to a preferred embodiment, the aqueous solution comprises:
  from 0.1 mM to 10 mM, preferably from 0.5 mM to 1.0 mM, of gold ions, and
  from 0.6 M to 3.0 M, preferably from 1.0 M to 2.0 M, of fluorine ions.

The aqueous solution can comprise organic or inorganic acid compounds, whether strong or weak, so as to vary the rate of attack on the silicon, in particular to increase or to reduce it. In one embodiment, the aqueous solution is devoid of acetic acid $CH_3COOH$.

In addition, the solution can comprise a surface-active agent, if it is desired to further reduce the thickness of the nickel or cobalt layer which it is desired to deposit in a subsequent stage.

The surface-active agent can be chosen from compounds comprising at least one anionic or nonionic polar group and an alkyl chain, having at least 10 carbon atoms, for example from 10 to 16 carbon atoms, preferably from 10 to 14 carbon atoms. The alkyl chain is preferably linear. It advantageously comprises 12 carbon atoms (also known as dodecyl).

This specific surfactant makes it possible to stabilize the gold nanoparticles formed after the oxidation/reduction reaction with the polycrystalline silicon. It also makes it possible to increase their number and to further disperse them at the surface of the silicon. By adding this surfactant to the activation bath, the size of the metallic gold particles can be reduced while increasing their density. The inventors have demonstrated that surfactants of larger size do not make it possible to obtain a result as advantageous as this.

This distribution of the gold particles makes it possible to deposit layers of nickel and then of nickel silicide which are simultaneously very thin and continuous, which the processes of the prior art, for which it is necessary to deposit more nickel in order to guarantee an even deposited layer over all the surface of the silicon, do not make possible. The thickness of the nickel layer can advantageously be less than 150 nm, for example be between 10 and 45 nm. In some applications, it can be of the order of 10 to 25 nm.

An ionic, cationic or anionic surfactant, which makes possible both electrostatic and steric stabilization of the nanoparticles on the surface of the polycrystalline silicon, is preferred.

The surface-active agent can have a molecular weight of between 100 g/mol and 5000 g/mol, preferably a molecular weight of between 100 g/mol and 1500 g/mol and more preferably a molecular weight of between 200 g/mol and 500 g/mol.

Preference is given in particular to an anionic surface-active agent having a molecular weight of between 100 g/mol and 1 500 g/mol.

The polar group can be a nonionic group, preferably a polyoxyalkylene glycol group, for example a polyoxyethylene glycol or polyoxypropylene glycol group. In this embodiment, the surface-active agent can be chosen from polyoxyalkylene glycol alkyl ethers, preferably polyoxyalkylene glycol alkyl ethers comprising an alkyl chain having from 10 to 16 carbon atoms, such as, for example, polyoxyethylene glycol dodecyl ethers.

The polar group can be an anionic group, such as a sulfonate ($-SO_3^-$), a sulfate ($-OSO_3^-$) or a carboxylate ($-COO^-$). A sulfate is preferred in the context of the invention. The surface-active agent is preferably an alkyl sulfate of formula $R-OSO_3^-$ in which R is a linear alkyl group having from 10 to 14 carbon atoms, preferably 12 carbon atoms. The surface-active agent can, for example, be sodium dodecyl sulfate.

The surface-active agent preferably represents from 0.1 to 5% by weight, for example from 2.5 to 3.5% by weight, of the solution.

According to a preferred embodiment, the aqueous solution comprises from 0.5 mM to 1 mM of chloroauric acid ($HAuCl_4$), from 1.0 to 2.0 M of hydrofluoric acid (HF) and optionally from 2.5 to 3.5% by weight of sodium dodecyl sulfate, with respect to the weight of the composition.

Preferably, this stage of activation of the silicon substrate by deposition of metallic gold grains at its surface is carried out at a temperature of between 15 and 30° C. and more preferably at a temperature of between 20 and 25° C.

The duration of contact between the aqueous solution and the silicon substrate is generally of the order of 5 seconds to 5 minutes, preferably from 10 seconds to 2 minutes and more preferably between 20 and 40 seconds. The duration of activation will be chosen as a function of the size and of the number of gold grains which it is desired to form at the surface of the silicon substrate. Advantageously, a size of gold grains of the order of 5 to 15 nm, preferably of the order of 10 nm, will be chosen.

The operation in which the surface of the substrate is brought into contact with the activation solution is advantageously carried out by immersion of the substrate in the activation solution, optionally with stirring.

The substrate thus treated is advantageously copiously rinsed with deionized water and dried under a stream of nitrogen, in order to remove any trace of activation solution.

The second stage of the process of the invention consists in depositing by an electroless route, on the substrate covered with gold particles, a layer essentially composed of nickel or of cobalt. Essentially is understood to mean more than 90% by weight, it being possible for the other elements to be boron, phosphorus or tungsten.

The layer essentially composed of nickel or of cobalt is advantageously uniform when it covers a flat surface and conformal when it covers three-dimensional structures which have been hollowed out from the silicon (example of TSV vias and NAND memory trenches).

The uniformity within the meaning of the invention is equal to the variation in the thickness of the layer essentially composed of nickel or of cobalt on the covered surface. The uniformity of the layer essentially composed of nickel or of cobalt obtained according to the process of the invention is advantageously less than 10%, preferably less than 5% and more preferably less than 1%.

The conformality within the meaning of the invention is equal to the ratio of the thickness of the layer at the top to the thickness of the layer at the bottom of a structure. The conformality within the meaning of the invention can also be equal to the variation in the thickness of the layer over the assembly consisting of the top, the sides and the bottom of the structure.

The conformality of the layer essentially composed of nickel or of cobalt obtained according to the process of the invention is advantageously between 90 and 110%, preferably greater than 95% and more preferably greater than 99%.

The trenches are generally etched into the silicon and then metalized down to the desired depth before thinning the silicon wafer. The shape and the size of the trenches can vary as a function of the use of the device. The trenches are commonly characterized by their depth, their diameter at the opening and their aspect ratio, which defines the ratio of the depth to the diameter of the cavity. For example, a trench with an aspect ratio of 10:1 has a diameter ten times smaller in size than its depth.

The layer essentially composed of nickel or of cobalt is advantageously conformal when it covers the surface of very deep structures: the ratio of coverage of the top to the bottom of the structure is advantageously between 90 and 110% when the layer covers trenches exhibiting high aspect ratios, in particular greater than 5:1, preferably greater than 10:1.

The aspect ratio—expressed as the ratio of the depth to the opening diameter of the cavities—can vary from 5:1 to 1000:1, in particular in the case of a NAND memory device, the surface of which is composed of an alternation of polycrystalline silicon layers and of $SiO_2$ layers. The process according to the invention advantageously makes it possible to deposit a nickel metal layer in cavities exhibiting particularly high aspect ratios, for example greater than 10:1 and above. The aspect ratio of the trenches can advantageously be very high and be between 10:1 and 1000:1, for example between 50:1 and 500:1 or between 100:1 and 200:1.

The process of the invention makes it possible to cover the surface of the cavities having a diameter at their opening ranging from 10 to 100 nm and a depth ranging from 500 nm to 10 microns with a layer essentially composed of nickel or of cobalt having a thickness of between 10 and 150 nm, the conformality of which is greater than 90%, preferably greater than 95%, and more preferably greater than 99%.

The metal deposition is carried out by a nonelectrochemical process, also known as an auto-catalytic or "electroless" process, which does not require electrical polarization of the substrate.

The metal deposited layer can be nickel, cobalt, a nickel-boron (NiB) alloy, a cobalt-boron (CoB) alloy, a nickel-phosphorus (NiP) alloy, a cobalt-phosphorus (CoP) alloy or a cobalt-tungsten-phosphorus (CoWP) alloy.

The deposited layer of nickel or of cobalt is preferably obtained by exposing the activated substrate to an aqueous solution comprising:
  at least one metal salt of nickel or of cobalt ions, preferably at a concentration of between $10^{-3}$ M and 1 M;
  at least one reducing agent for the nickel or cobalt ions, preferably in an amount of between $10^{-4}$ M and 1 M; and
  optionally at least one stabilizing agent for the nickel or cobalt ions, preferably in an amount of between $10^{-3}$ M and 1 M.

The nickel or cobalt salt is preferably a water-soluble salt chosen from the group consisting of chloride, acetate, acetylacetonate, hexafluorophosphate, nitrate, perchlorate, sulfate and tetrafluoroborate.

A metal salt which is preferred in the context of the present invention is chosen from nickel or cobalt sulfate, nickel or cobalt chloride, nickel or cobalt acetate, or nickel or cobalt sulfamate. For example, nickel sulfate hexahydrate is chosen.

Advantageously, the reducing agent can be chosen from the group consisting of phosphorus derivatives, boron derivatives, glucose, formaldehyde and hydrazine.

The phosphorus derivatives can be chosen from hypophosphorous acid ($H_3PO_2$) and its salts and the boron derivatives can be chosen from borane complexes.

The reducing agent used is advantageously chosen from boron derivatives and in particular from dimethylamine-borane, trimethylamine-borane, triethylamine-borane, pyridine-borane, morpholine-borane or tert-butylamine-borane. Preferably, dimethylamine-borane (DMAB) will be used.

The stabilizing agent can be chosen from the compounds which can complex with the nickel ions or with the cobalt ions, so as to prevent the reduction of the metal ions in solution by the reducing agent in the absence of catalyst.

The stabilizing agent for the metal ions can be chosen from the group consisting of ethylenediamine and the salts of acetic, propionic, succinic, hydroxyacetic, malonic, aminoacetic, malic or citric acid. Preferably, citric acid or one of its salts is chosen in order to stabilize the $Ni^{2+}$ or $Co^{2+}$ ions.

The pH of the aqueous solution can be acidic or basic and can be adjusted within the desired pH range by means of one or more pH-modifying compounds (or buffers), such as those described in the Handbook of Chemistry and Physics—$84^{th}$ edition, by David R. Lide, published by CRC Press.

The aqueous solution can, for example, comprise an agent which makes it possible to adjust the pH to a value of between 3 and 12, for example a non-polymeric amine in order to adjust the pH between 8 and 12.

Generally, the metal layer can be produced by dipping the substrate in the aqueous solution defined above, at a temperature of between 50 and 90° C., preferably at 65° C., for a period of time of 30 s to 30 min, according to the thickness of the layer desired.

A prior stage of prewetting the substrate can be carried out before exposing the substrate to the aqueous solution according to the invention. The substrate is, for example, immersed in an aqueous solution or a solution comprising the metal salt with its stabilizing agent but without a reducing agent. Preferably, deionized water is used. The assembly is subjected to a partial vacuum below 500 mbar for 1 to 30 min, preferably for 5 to 15 min.

The stage of depositing the nickel or cobalt layer can be carried out by rotating the substrate to be coated at a speed of between 20 and 600 revolutions per minute, by applying ultrasound or megasound, or else by applying simple recirculation of the aqueous solution in the reactor.

With the aqueous solution as defined above, used within the abovementioned general temperature range, a metal film was obtained exhibiting a thickness of between 6 and 200 nanometers for a contact time of between 1 min and 20 min.

According to one embodiment, the layer essentially composed of nickel or of cobalt is a nickel-boron layer deposited by exposing the surface of the activated substrate to an aqueous solution comprising a nickel salt, a boron-based reducing agent and a stabilizing agent, the pH of the solution being between 9 and 12 and the temperature of the aqueous solution being between 50° C. and 90° C.

The aqueous solution comprising the nickel salt can in addition advantageously comprise a suppressing agent which is absorbed at the surface of the metal layer as it is being formed.

The suppressing agent is preferably a polymer comprising "amine" groups or functional groups chosen in particular from polymers and copolymers derived from chitosans, poly(allylamine)s, poly(vinylamine)s, poly(vinylpyridine)s, poly(aminostyrene)s, poly(ethyleneimine)s, poly(L-lysine)s and the acid (or protonated) forms of these polymers.

According to one embodiment of the invention, it is preferable to use a homopolymer or copolymer of poly (ethyleneimine) in its nonprotonated form.

For example, the choice will be made of a linear poly (ethyleneimine) with a number-average molar mass $M_n$ of between 500 and 25 000 g/mol.

The concentration of polymer having amine functional groups used according to the present invention advantageously ranges from 1 to 250 ppm, more particularly from 1 to 100 ppm, more preferably from 1 to 10 ppm, for example from 1.5 to 3 ppm (1 ppm equivalent to 1 mg/kg of solution).

When the polymer having amine functional groups is a poly(ethyleneimine), the pH of the aqueous solution advantageously ranges from 8 to 12, preferably from 8.5 to 10. It is in particular of the order of 9, for example between 8.9 and 9.1. In this case, use may be made of tetramethylammonium hydroxide (TMAH), triethanolamine, N,N-dimethyl-ethanolamine or N-methylethanolamine as agent which makes it possible to adjust the pH.

The thickness of the nickel or cobalt layer is preferably uniform or conformal. It is between 10 nm and 150 nm, more preferably between 10 nm and 100 nm, indeed even between 10 nm and 40 nm. The thickness of the nickel or cobalt layer can even be between 10 nm and 20 nm.

The substrate covered with the nickel or boron metal layer can subsequently be subjected to a rapid thermal annealing well known to a person skilled in the art. The temperature is generally between 300° C. and 750° C., so as to form the nickel silicide or the cobalt silicide. Under the effect of the heat, the nickel or cobalt atoms migrate into the silicon layer. Rapid is generally understood to mean less than 5 minutes, for example less than 3 minutes.

The temperature can be lowered to between 300° C. and 500° C., indeed even between 350° C. and 450° C., for example be between 325° C. and 375° C. According to one embodiment of the invention, the rapid thermal annealing is carried out at a temperature between 325° C. and 375° C. for 30 seconds to 2 minutes.

The thermal annealing can be carried out with a tubular oven or a heating plate.

A tubular oven is a tube-shaped electrical heating oven which makes it possible to accommodate samples of various shapes and sizes. In the context of the invention, it accommodates glass tubes, comprising samples, by loading in the longitudinal axis. A stream of a chosen and controlled gas can be combined with the heating of the assembly inside the glass tube.

In the context of the preferred applications of the invention, the process which has just been described can be supplemented by a stage of removal of the nickel or cobalt which has not migrated into the silicon and which has remained at the surface of the silicon substrate, on conclusion of the RTA stage.

Consequently, the nickel or the cobalt which has not migrated into the silicon on conclusion of the thermal annealing stage can be removed by chemical cleaning.

The substrate comprising silicon can be a substrate composed of silicon, preferably polycrystalline silicon. The substrate can comprise a vertical alternation at its surface of regions of silicon and of regions of a dielectric chosen from $SiO_2$, $Si_3N_4$, SiOC and SiC. The invention exhibits the advantage of making possible a selective deposition of nickel on the silicon regions; the dielectric regions are not covered with nickel, which limits the unnecessary consumption of metal.

The substrate comprising silicon to be coated can be flat without a design, or flat and comprise hollow vertical structures exhibiting dimensions such that their diameter at the opening is between 20 and 100 nm and their depth is between 500 nm and 3 microns.

The process of the invention has applications in the manufacture of electronic devices, such as, in particular, erasable NAND memories used in USB keys, MS cards and SD cards for the storage and the general transfer of data.

A second subject matter of the invention is a process for the formation of a nickel or cobalt layer on a silicon substrate, comprising the stages consisting in:
 exposing the surface of the silicon-comprising substrate with an aqueous solution comprising gold ions, fluorine ions and a surface-active agent chosen from polymers and compounds comprising an anionic or nonionic polar group and an alkyl chain comprising from 10 to 14 carbon atoms, so as to form metallic gold particles, and
 depositing by an electroless route, on the substrate covered with gold particles, a layer essentially composed of nickel or of cobalt and with a thickness of between 10 and 150 nm, preferably from 10 to 40 nm and more preferably from 10 to 25 nm.

The characteristics which have been described in connection with the first subject matter of the invention can be applied to the second subject matter of the invention.

The third subject matter of the present invention is a process for the manufacture of a NAND memory comprising a process for the formation of nickel silicide or cobalt silicide as described above.

Another, fourth, subject matter of the invention relates to a process for the manufacture of photovoltaic cells comprising a process for the formation of nickel silicide or of cobalt silicide as described above.

A better understanding of the invention will be obtained on reading the description of the following nonlimiting examples, made with reference to the appended figures.

The examples which follow were carried out on the laboratory scale.

Unless otherwise indicated, these examples were carried out under standard temperature and pressure conditions (approximately 25° C. under approximately 1 atm) in ambient air and the reactors used were directly obtained commercially without additional purification.

Reference Example 1

Activation of a Substrate Covered with a Layer of Polycrystalline Silicon Starting from a Solution Comprising a Noble Metal Salt and Hydrofluoric Acid a) Cleaning the Surfaces:

Depending on the origin of the substrate and on his requirements, a person skilled in the art will know how to adapt a protocol for cleaning the surface. In our case, no cleaning was necessary since the activation solution is also a slow etching solution. In this example, the substrate used is a silicon coupon with side lengths of 1 cm×2 cm and with a thickness of 750 μm covered with a layer of silicon dioxide ($SiO_2$) having a thickness of approximately 90 nm, itself covered with a layer of polycrystalline silicon with a thickness of approximately 190 nm.

b) Activation of the Surface of the Substrate:

b1) Preparation of the Activation Solution:

50 ml of a mixture of hydrochloric acid at 2.5% by weight (1.5 M) and 15 mg of the chosen noble metal salt are prepared at ambient temperature in a clean PTFE beaker. Table 1 gives information on the type and the amounts of noble metal salt used.

b2) Activation Treatment on the Surface of the Substrate:

The substrate described in stage a) is immersed for a given time (see table 1) in the mixture prepared in stage b1). The substrate thus treated is copiously rinsed with deionized water and dried under a stream of nitrogen.

c) Deposition of a Layer of NiB Metal by an Electroless Process:

c1) Preliminary Preparation of the Electroless Solution:

31.11 g of nickel sulfate hexahydrate (0.118 mol), 44.67 g of citric acid (0.232 mol), 52.26 g of N-methylethanolamine (0.700 mol) and 2.5 ppm of polyethyleneimine (PEI) with an $M_n$=600 g/mol are introduced, in order, into a 1 liter container and a minimum amount of deionized water. The final pH was adjusted to 9 with the base and the total volume was adjusted to 1 liter with deionized water.

One volume of a reducing solution is added to 9 volumes of the preceding solution, immediately before the following stage. This reducing solution comprises 28 g/l of dimethylamine-borane (DMAB; 0.475 mol) and 60.00 g of N-methylethanolamine (0.798 mol).

c2) Formation of the Layer of NiB Alloy on the Layer of Polycrystalline Silicon:

A layer of NiB nickel alloy was deposited on the surface of the substrate treated in stage b) by immersing it in the electroless solution prepared previously and brought to 65° C., for a period of 30 seconds to 5 minutes, according to the final thickness desired.

d) Formation of the Nickel Silicide:

The sample obtained at stage c), with the nickel alloy on it, is subjected to rapid thermal annealing (RTA) at 350° C. for 1 minute. The operation can be carried out with a tubular oven or a heating plate.

Results:

TABLE 1

| Entry | Noble metal salt | Concentration of noble metal salt (ppm) | HF concentration (M) | Activation time (in sec.) | Deposition of nickel by an electroless process | Diffusion of the nickel into the silicon | Minimum thickness of the nickel layer (nm) |
|---|---|---|---|---|---|---|---|
| 1 | $(NH_4)_2PdCl_4$ | 240 | 1.5 | 30 | Yes | Nonuniform diffusion | 200 |
| 2 | $CuSO_4$ | 240 | 1.5 | 30 | Yes | No | 50 |
| 3 | AgAc | 240 | 1.5 | 30 | Yes | No | 60 |
| 4 | $HAuCl_4$ | 240 | 1.5 | 30 | Yes | Yes | 50 |

Comments:

This first series of tests makes it possible to underline the importance of the nature of the noble metal used for the migration of the nickel into the silicon. The palladium(II) solutions are capable of activating the surface but give conformal nickel thicknesses which are much greater than those targeted. Furthermore, it is observed that the silver and copper salts do not make it possible to bring about the migration of the nickel into the silicon at a thermal annealing temperature of 350° C. Finally, the gold(III) salt makes it possible to obtain a thin layer of nickel-boron alloy but also the uniform migration of the latter into the silicon.

Example 2

Activation of a Substrate Covered with a Layer of Polycrystalline Silicon Starting from a Solution According to the Invention Comprising a Gold(III) Salt, Hydrofluoric Acid and a Surface-Active Agent a) Cleaning of the Surfaces:

This stage is identical to stage a) of example 1.

b) Activation of the Surface of the Substrate:

b1) Preparation of the Activation Solution According to the Invention:

50 ml of a mixture of hydrofluoric acid at 2.5% by weight, 240 ppm of gold(III) hydrochloride and a surface-active agent (see table 2) were prepared at ambient temperature in a clean PTFE beaker.

b2) Activation Treatment of the Surface of the Substrate:

The substrate described in stage a) is immersed for a given time (see table 2), in this case 30 seconds, in the mixture prepared in stage b1). The substrate thus treated is copiously rinsed with deionized water and dried under a stream of nitrogen.

c) Deposition of a Layer of NiB Metal by an Electroless Process:

c1) Preliminary Preparation of the Electroless Solution:

The electroless solution used and the operating conditions are identical to those of stage c1), example 1.

c2) Formation of the Layer of NiB Nickel Alloy on the Layer of Polycrystalline Silicon:

A layer of NiB metal alloy was prepared on the surface of the substrate treated in stage b) by immersing it in the electroless solution prepared previously and brought to 65° C., for a period of 30 seconds to 5 minutes, according to the final thickness desired. The duration of immersion in the electroless solution is determined so as to obtain a minimum nickel thickness with a good uniformity and conductivity.

The thickness of the layer is measured by scanning electron microscopy by taking a cross section of the sample.

The method which makes it possible to measure the conductivity and the uniformity is the four-point measurement method known to a person skilled in the art.

The results are presented in table 2, where the minimum thickness is obtained with different stabilizing agents.

TABLE 2

| Test No. | $HAuCl_4$ concentration (mM) | HF concentration (M) | Nature of the surfactant | Surfactant concentration (g/l) | Thickness of the nickel layer (nm) |
|---|---|---|---|---|---|
| 1 comparative | 0.7 mM | 1.5 | None | / | 50 |
| 2 comparative | 0.7 mM | 1.5 | Polyvinyl-pyrrolidinone (PVP) 3500 g/mol | 3 | 45 |
| 3 | 0.7 mM | 1.5 | Brij 35* 1225 g/mol | 3 | 40 |
| 4 | 0.7 mM | 1.5 | Sodium dodecyl sulfate (SDS) 288 g/mol | 3 | 20 |

*Brij 35: polyoxyethylene glycol dodecyl ether

Figure 1:
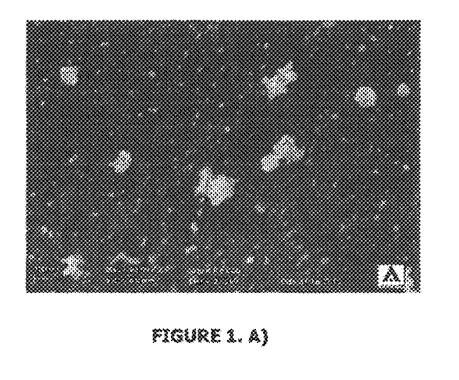
FIG. 1 represents two scanning electron microscope images showing the gold nanoparticles on the polycrystalline silicon surface which were obtained A) in the absence of surface-active agent and B) in the presence of surface-active agent.

This second series shows the positive impact of a surfactant of low molecular weight in stabilizing the gold nanoparticles formed after an oxidation/reduction reaction with the polycrystalline silicon. By adding a stabilizing agent to the activation bath, the size of the metallic gold particles can be reduced while increasing their density. This distribution of the gold particles makes it possible to deposit a thinner nickel layer. The best result is obtained with an anionic surfactant (SDS), which makes possible electrosteric stabilization of the nanoparticles on the surface of the polycrystalline silicon, whereas nonionic surfactants, which bring about only steric stabilization (Brij 35), do not make it possible. The SDS molecule stabilizes the gold nanoparticles and increases their concentration on the surface of the polycrystalline silicon (see FIG. 1B).

d) Formation of the Nickel Silicide:

As in stage d), example 1, the sample obtained in stage c), covered with nickel alloy, is subjected to rapid thermal annealing at 350° C. for one minute. The sample is subsequently treated with a chemical solution in order to remove the unreacted nickel.

Figure 2:
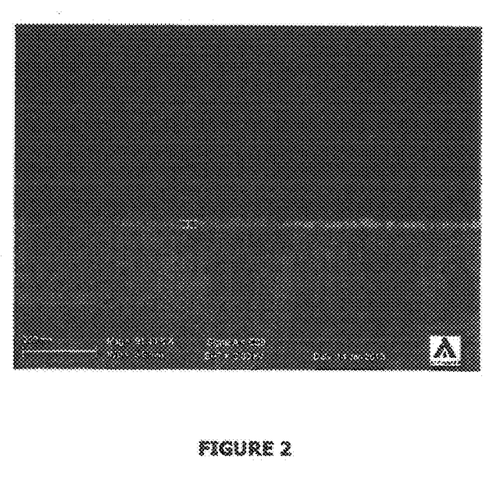
FIG. 2 represents an image obtained with a scanning electron microscope showing the deposition of a very thin layer of the nickel alloy (<20 nm) after activation with the solution of the invention.
Figure 3:
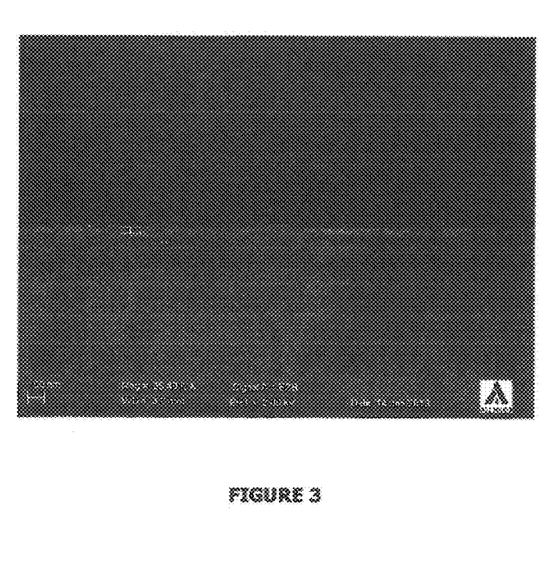
FIG. 3 is an image obtained with a scanning electron microscope showing the layer of nickel silicide NiSi (<40 nm) obtained after thermal annealing (350° C./1 min) and cleaning from the nickel which has not reacted or not migrated.

A section of the sample from test 4 is observed with a scanning electron microscope before and after thermal annealing and chemical etching. The thickness of 20 nm of the nickel alloy layer obtained after activation and electroless deposition is shown in FIG. 2. The thin and very homogeneous layer of nickel silicide formed after thermal annealing is presented in FIG. 3.

The layer of nickel silicide (NiSi) is very homogeneous with a thickness two times greater than that of the initial layer of nickel alloy. Perfect diffusion with a stochiometric reaction between the nickel and silicon (Ni:Si=1:1) is obtained with a good uniformity of the resulting layer.

The invention claimed is:

1. A process for forming nickel silicide or cobalt silicide on a silicon-comprising substrate, said process comprising the steps of:
    bringing a surface of the silicon-comprising substrate into contact with an aqueous solution comprising gold ions and fluoride ions in order to form particles of metallic gold on said surface, wherein the aqueous solution comprises a surface-active agent selected from the group consisting of compounds comprising at least one anionic or one nonionic polar group, and one alkyl chain comprising from 10 to 16 carbon atoms
    depositing—by an electroless route—a layer essentially composed of nickel or of cobalt, on the obtained surface covered with particles of metallic gold, wherein the thickness of the layer is between 10 and 45 nm, and the variation in the thickness of the layer is less than 10%, and
    applying a rapid thermal annealing at a temperature of between 300° C. and 750° C., so as to form nickel silicide or cobalt silicide.

2. The process as claimed in claim 1, wherein the surface of the silicon-comprising substrate is brought into contact with the aqueous solution for a duration of between 5 seconds and 5 minutes.

3. The process as claimed in claim 1, wherein the aqueous solution comprising fluoride ions is obtained by a step of incorporating hydrofluoric acid (HF), $NH_4F$, or one of their mixtures, into water.

4. The process as claimed in claim 1, wherein the aqueous solution comprising gold ions is obtained by a step of incorporating chloroauric acid ($HAuCl_4$) into water.

5. The process as claimed in claim 1, wherein the aqueous solution comprises:
    from 0.1 mM to 10 mM of gold ions, and
    from 0.6 M to 3.0 M of fluoride ions.

6. The process as claimed in claim 1, wherein the alkyl chain comprises from 10 to 14 carbon atoms.

7. The process as claimed in claim 1, wherein the layer essentially composed of nickel or of cobalt is a nickel-boron layer that is obtained by a step of bringing into contact said surface covered with particles of metallic gold with an aqueous solution comprising a nickel salt, a boron-based reducing agent, a stabilizing agent for nickel, and a polyamine, the pH of the solution being between 9 and 12 and the temperature of the aqueous solution being between 50° C. and 90° C.

8. The process as claimed in claim 1, further comprising a step of chemical cleaning of nickel silicide or cobalt silicide, so as to remove nickel or cobalt which has not migrated into the silicon at the end of the rapid thermal annealing stage.

9. The process as claimed in claim 1, wherein the rapid thermal annealing temperature ranges from 350° C. to 450° C.

10. The process as claimed in claim 1, wherein the surface-active agent has a molecular weight of between 100 g/mol and 1500 g/mol.

11. The process as claimed in claim 1, wherein the surface-active agent comprises an anionic polar group.

12. The process as claimed in claim 10, wherein the surface-active agent is sodium dodecylsulfate.

13. A process for the manufacture of a NAND memory comprising a process for the formation of nickel silicide or of cobalt silicide as defined in claim 1.

14. A process for the manufacture of photovoltaic cells comprising a process for the formation of nickel silicide or of cobalt silicide as defined in claim 1.

15. A process according to claim 1, wherein the thickness of the layer is between 10 and 25 nm.

16. A process according to claim 1, wherein the variation in the thickness of the layer is less than 5%.

17. A process for forming a layer that is essentially composed of nickel or of cobalt on a silicon-comprising substrate, said process comprising the steps of:
  exposing a surface of the silicon-comprising substrate with an aqueous solution comprising gold ions, fluoride ions and a surface-active agent chosen in the group consisting of compounds comprising at least one anionic or nonionic polar group, and one alkyl chain comprising from 10 to 16 carbon atoms, so as to activate the said surface of the silicon-comprising substrate, and
  depositing—by an electroless route—on the activated surface of the silicon-comprising substrate, a layer essentially composed of nickel or of cobalt that has a thickness between 10 and 45 nm, the variation in the thickness of the layer being less than 10%.

18. A process according to claim 17, wherein the thickness of the layer is between 10 and 25 nm.

19. A process according to claim 17, wherein the variation in the thickness of the layer is less than 5%.

* * * * *